United States Patent
Stamper et al.

(10) Patent No.: US 12,142,686 B2
(45) Date of Patent: Nov. 12, 2024

(54) FIELD EFFECT TRANSISTOR

(71) Applicant: GLOBALFOUNDRIES U.S. Inc., Malta, NY (US)

(72) Inventors: Anthony K. Stamper, Burlington, VT (US); Uzma Rana, Slingerlands, NY (US); Steven M. Shank, Jericho, VT (US); Mark D. Levy, Williston, VT (US)

(73) Assignee: GLOBALFOUNDRIES U.S. Inc., Malta, NY (US)

( * ) Notice: Subject to any disclaimer, the term of this patent is extended or adjusted under 35 U.S.C. 154(b) by 0 days.

(21) Appl. No.: 17/330,780

(22) Filed: May 26, 2021

(65) Prior Publication Data
US 2022/0384659 A1    Dec. 1, 2022

(51) Int. Cl.
*H01L 29/786* (2006.01)
*H01L 29/06* (2006.01)
*H01L 29/66* (2006.01)

(52) U.S. Cl.
CPC .... *H01L 29/78603* (2013.01); *H01L 29/0653* (2013.01); *H01L 29/66742* (2013.01); *H01L 29/78645* (2013.01)

(58) Field of Classification Search
CPC ........... H01L 29/78603; H01L 29/0653; H01L 29/78645
See application file for complete search history.

(56) References Cited

U.S. PATENT DOCUMENTS

| | | | |
|---|---|---|---|
| 4,948,745 A | | 8/1990 | Pfiester et al. |
| 4,966,861 A | * | 10/1990 | Mieno ............... H01L 21/02576 438/300 |
| 5,213,991 A | * | 5/1993 | Inokawa ............... H01L 29/456 257/E21.426 |
| 5,612,230 A | * | 3/1997 | Yuzurihara ..... H01L 21/823475 257/E21.627 |
| 5,872,039 A | * | 2/1999 | Imai ................... H01L 29/41775 257/E21.426 |
| 6,051,473 A | | 4/2000 | Ishida et al. |
| 6,124,627 A | * | 9/2000 | Rodder ............. H01L 29/42376 257/E29.135 |
| 6,130,457 A | * | 10/2000 | Yu ..................... H01L 21/76264 257/349 |

(Continued)

FOREIGN PATENT DOCUMENTS

KR     20080062064     7/2008

OTHER PUBLICATIONS

Huang et al., "A MOS Transistor with Self-Aligned Polysilicon Source-Drain", IEEE, May 1986, vol. EDL-7, No. 5, 3 pages.

(Continued)

*Primary Examiner* — Eugene Lee
(74) *Attorney, Agent, or Firm* — Francois Pagette; Andrew M. Calderon; Calderon Safran & Wright P.C.

(57) ABSTRACT

The present disclosure relates to semiconductor structures and, more particularly, to field effect transistors and methods of manufacture. The structure includes: at least one gate structure having source/drain regions; at least one isolation structure within the source/drain regions in a substrate material; and semiconductor material on a surface of the at least one isolation structure in the source/drain regions.

18 Claims, 10 Drawing Sheets

(56) References Cited

U.S. PATENT DOCUMENTS

| | | | |
|---|---|---|---|
| 6,174,754 B1* | 1/2001 | Lee | H01L 29/66651 |
| | | | 438/149 |
| 6,211,552 B1* | 4/2001 | Efland | H01L 29/0847 |
| | | | 257/338 |
| 6,299,314 B1 | 10/2001 | Igarashi et al. | |
| 6,372,584 B1 | 4/2002 | Yu | |
| 6,724,049 B2* | 4/2004 | Fujiwara | H01L 29/458 |
| | | | 257/349 |
| 6,743,666 B1 | 6/2004 | Chan | |
| 6,821,856 B2* | 11/2004 | Takagi | H01L 29/458 |
| | | | 257/E29.147 |
| 6,833,586 B2* | 12/2004 | Tsuchiko | H01L 29/42364 |
| | | | 257/E29.066 |
| 7,078,722 B2 | 7/2006 | Anderson et al. | |
| 7,315,067 B2* | 1/2008 | Wang | H01L 29/4983 |
| | | | 257/E29.268 |
| 7,385,274 B2* | 6/2008 | Lee | H01L 21/823462 |
| | | | 257/500 |
| 7,671,423 B2* | 3/2010 | Voldman | H01L 27/0922 |
| | | | 257/369 |
| 8,101,479 B2* | 1/2012 | Parker | H01L 21/2652 |
| | | | 438/231 |
| 8,174,071 B2* | 5/2012 | Tien | H01L 29/66659 |
| | | | 438/296 |
| 8,183,633 B2 | 5/2012 | Kwon et al. | |
| 8,288,825 B2 | 10/2012 | Chong et al. | |
| 8,575,691 B2* | 11/2013 | Liu | H01L 29/0878 |
| | | | 257/343 |
| 8,754,530 B2 | 6/2014 | Babich et al. | |
| 9,136,329 B2 | 9/2015 | Huang et al. | |
| 9,240,454 B1* | 1/2016 | Liu | H01L 29/456 |
| 9,748,383 B2* | 8/2017 | Hu | H01L 29/7835 |
| 10,580,893 B2 | 3/2020 | Adusumilli et al. | |
| 10,763,213 B2 | 9/2020 | Dalalleau et al. | |
| 10,763,328 B2* | 9/2020 | Aydin | H01L 27/1203 |
| 2002/0137295 A1 | 9/2002 | Thei et al. | |
| 2007/0018236 A1* | 1/2007 | Tsuchiaki | H01L 29/78687 |
| | | | 257/E29.147 |
| 2007/0057280 A1* | 3/2007 | Hayashi | H01L 29/7833 |
| | | | 257/E29.267 |
| 2008/0067615 A1* | 3/2008 | Kim | H01L 29/7835 |
| | | | 257/E29.345 |
| 2008/0290411 A1* | 11/2008 | Lee | H01L 29/7833 |
| | | | 438/296 |
| 2012/0313151 A1* | 12/2012 | Lee | H01L 21/743 |
| | | | 257/288 |
| 2013/0210207 A1* | 8/2013 | Fukuda | H01L 29/665 |
| | | | 438/296 |
| 2015/0021738 A1 | 1/2015 | Camillo-Castillo et al. | |
| 2015/0035568 A1 | 2/2015 | Peng et al. | |
| 2018/0166536 A1 | 6/2018 | Shank et al. | |
| 2019/0123166 A1 | 4/2019 | Kanawati | |
| 2019/0312142 A1 | 10/2019 | Adusumilli et al. | |
| 2021/0167205 A1* | 6/2021 | Wang | H01L 29/1087 |
| 2022/0320087 A1* | 10/2022 | Lu | H01L 29/0649 |

OTHER PUBLICATIONS

Office Action in U.S. Appl. No. 17/344,391 dated Oct. 25, 2022, 17 pages.

Response to Office Action in U.S. Appl. No. 17/344,391 dated Jan. 19, 2023, 14 pages.

Wikimedia Commons, "CMOS-chip structure in 2000s", https://commons.wikimedia.org/wiki/File:Cmos-chip_structure_in_2000s_(en).svg, Dec. 9, 2006 (Year: 2006).

Office Action in U.S. Appl. No. 17/344,391 dated Mar. 8, 2023, 20 pages.

Response to Office Action in U.S. Appl. No. 17/344,391 dated Apr. 18, 2023, 15 pages.

Second Response to Office Action in U.S. Appl. No. 17/344,391 dated May 5, 2023, 12 pages.

Notice of Allowance in U.S. Appl. No. 17/344,391 dated May 31, 2023, 9 pages.

* cited by examiner

FIELD EFFECT TRANSISTOR

FIELD OF THE INVENTION

The present disclosure relates to semiconductor structures and, more particularly, to field effect transistors and methods of manufacture.

BACKGROUND

Radio frequency (RF) devices are used in many different types of communication applications. For example, RF devices can be used in cellular telephones with wireless communication components such as switches, MOSFETs, transistors and diodes. Currently, there is an increasing need to provide higher performance and lower price points for the wireless communication components. A significant fraction of the cost of manufacturing a RF switch, for example, is the cost to engineer very high linearity such that harmonic distortion is extremely low and meets product specifications.

RF devices formed on bulk silicon substrate have high source/drain junction capacitance as compared to similar devices formed on SOI wafers, which degrades Coff. Devices built on bulk Si substrates have been known to suffer from degraded linearity, harmonics, noise, and leakage currents, any of which will degrade device performance thus necessitating the higher cost of SOI wafers.

Accordingly, RF devices are typically manufactured on high resistivity silicon wafers or substrates to achieve the needed RF linearity. State-of-the-art trap rich silicon on insulator (SOI) high resistivity substrates offer excellent vertical isolation and linearity, but the SOI wafer can be a significant portion of the total manufacturing cost because they can be 2 to 10 times the cost of high resistivity non-SOI substrates.

SUMMARY

In an aspect of the disclosure, a structure comprises: at least one gate structure comprising source/drain regions; at least one isolation structure within the source/drain regions and in a substrate material; and semiconductor material on a surface of the at least one isolation structure in the source/drain regions.

In an aspect of the disclosure, a structure comprising: a semiconductor substrate; a gate structure comprising source/drain regions over the semiconductor substrate; at least one shallow trench isolation structure within the semiconductor substrate and within the source/drain regions of the gate structure; semiconductor material over the at least one shallow trench isolation structures and under the gate structure; and silicide on the semiconductor material over the at least one shallow trench isolation structure.

In an aspect of the disclosure, a method comprising: forming at least one gate structure comprising source/drain regions; forming at least one isolation structure within the source/drain regions in a substrate material; and forming semiconductor material on a surface of the at least one isolation structure in the source/drain regions.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to field effect transistors and methods of manufacture. More specifically, the field effect transistors include shallow trench isolation structures under (within) diffusion regions (e.g., source/drain regions) with a silicided semiconductor material over the shallow trench isolation structures for source/drain contacts. Advantageously, the placement of the shallow trench isolation structures in the source/drain regions will reduce Coff in bulk technologies. For example, Coff in bulk technologies can be reduced by greater than 10%. Moreover, the use of the shallow trench isolation structures in the source/drain regions can be of benefit to logic FET (e.g., reduced load capacitance) and low noise amplifiers (LNA) (e.g., improved Ft/Fm and gain), etc.

In embodiments, the field effect transistor (FET) may be a single finger or multi-finger FET with shallow trench isolation structures in both, between active devices and in source/drain regions. In embodiments, the source/drain regions may be composed of silicided polysilicon or silicided crystalline silicon directly over and/or adjacent to the shallow trench isolation structures to provide contacts to the source/drain regions. In any of these scenarios, the shallow trench isolation structures can be used to mimic semiconductor on insulator (SOI) substrates to provide a higher substrate resistivity and, hence, reduce Coff in bulk semiconductor technologies.

In further embodiments, the silicided polysilicon or crystalline silicon may extend only partially (e.g., include a break) over selected shallow trench isolation structures to avoid shorting of transistors (e.g., gate structures). Moreover, in the implementation using silicided polysilicon, single crystalline semiconductor material may be formed under the gate structures and in direct contact with the silicided polysilicon, at a same level, to preferably separate the silicided polysilicon from the gate structure, e.g., sidewall spacers of the gate structure.

The FETs of the present disclosure can be manufactured in a number of ways using a number of different tools. In general, though, the methodologies and tools are used to form structures with dimensions in the micrometer and nanometer scale. The methodologies, i.e., technologies, employed to manufacture the FETs of the present disclosure have been adopted from integrated circuit (IC) technology. For example, the structures are built on wafers and are realized in films of material patterned by photolithographic processes on the top of a wafer. In particular, the fabrication of the FETs uses three basic building blocks: (i) deposition of thin films of material on a substrate, (ii) applying a patterned mask on top of the films by photolithographic imaging, and (iii) etching the films selectively to the mask.

Figure 1:
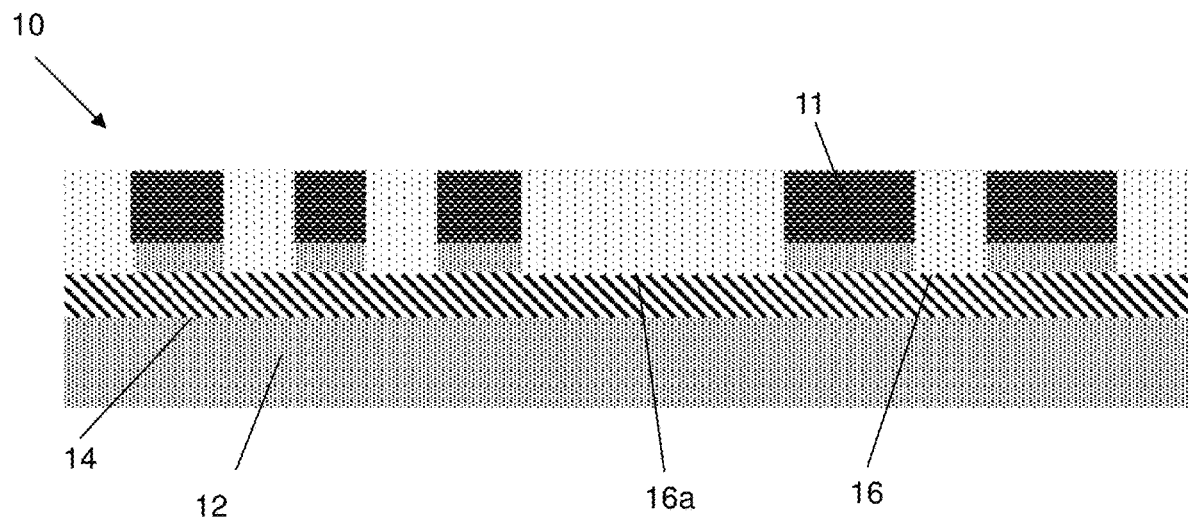
FIG. 1 shows a semiconductor substrate with shallow trench isolation structures, amongst other features, and respective fabrication processes in accordance with aspects of the present disclosure.

FIG. 1 shows a substrate and shallow trench isolation structures, amongst other features, and respective fabrication processes in accordance with aspects of the present disclosure. Specifically, the structure 10 of FIG. 1 includes a semiconductor substrate 12 with shallow trench isolation structures 16, 16a. In embodiments, the upper surfaces of the semiconductor substrate 12 and shallow trench isolation structures 16, 16a may be planar.

In embodiments, the semiconductor substrate 12 is a bulk substrate composed of any suitable semiconductor material including, but not limited to, Si, SiGe, SiGeC, SiC, GaAs, InAs, InP, and other III/V or II/VI compound semiconductors. Semiconductor on glass or insulator is also envisioned. An optional high resistivity layer 14 can be provided within the semiconductor substrate 12. In embodiments, the high resistivity layer 14 may be a polysilicon layer formed by an argon implant process, although other methods and material layers are also contemplated herein. In embodiments, the semiconductor substrate 12 is a high resistivity silicon substrate. In embodiments, the high resistivity silicon substrate has resistivity >1000 ohm-cm.

Dopant 11, such as to form, for example, wells, halos, extensions, or lightly doped drains, may be formed in the semiconductor substrate 12 between the shallow trench isolation structures 16, 16a. For simplicity, these dopants will be referred to as well dopants, even though they may consist of additional implants as described above. (The well dopants 11 are shown only in FIG. 1 for simplicity sake; although it should be understood that these well dopants are present for all gate structures.) The well dopants 11 may be formed by conventional ion implantation processes. For example, the well dopants 11 may be formed by introducing a dopant by, for example, ion implantation that introduces a concentration of a dopant in the semiconductor substrate 12. A P-well is doped with p-type dopants, e.g., Boron (B), and an N-well is doped with n-type dopants, e.g., Arsenic (As), Phosphorus (P) and Sb, among other suitable examples.

The shallow trench isolation structures 16, 16a may be composed of oxide material, e.g., $SiO_2$, fabricated by conventional lithography, etching and deposition methods known to those of skill in the art. In embodiments, the shallow trench isolation structures 16, 16a may be in the source/drain regions of subsequently formed devices. Shallow trench isolation structures, filled with insulator, are commonly employed to provide electrical isolation between active devices such as FETs. In the structures described herein, though, these shallow trench isolation structures are placed in the source/drain region of the FET. In conventional structures, the shallow trench isolation structures are not placed in the source/drain regions because that would make it impossible to electrically connect the source/drain region of the FET's. This has been solved by the present disclosure, amongst other advantages described herein.

To fabricate the shallow trench isolation structures 16, 16a, for example, a resist formed over the semiconductor substrate 12 is exposed to energy (light) to form a pattern (opening). An etching process with a selective chemistry, e.g., reactive ion etching (RIE), will be used to form one or more trenches in the semiconductor substrate 12 through the openings of the resist. In embodiments, the openings extend through the well dopants 11 and to the optional high resistance layer 14. Following the resist removal by a conventional oxygen ashing process or other known stripants, the insulator material can be deposited by any conventional deposition processes, e.g., chemical vapor deposition (CVD) processes. Any residual material on the surface of the semiconductor substrate 12 can be removed by conventional chemical mechanical polishing (CMP) processes.

Figure 2:
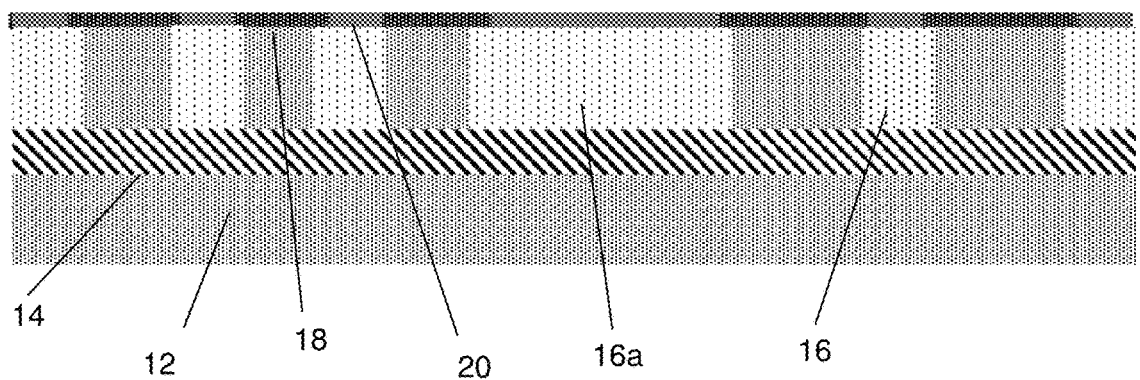
FIG. 2 shows semiconductor material formed on the semiconductor substrate and shallow trench isolation structures, amongst other features, and respective fabrication processes in accordance with aspects of the present disclosure.

In FIG. 2, semiconductor material 18, 20 may be formed on a surface of the semiconductor substrate 12 and shallow trench isolation structures 16, 16a. In embodiments, the semiconductor material 18, 20 will not be at a same topography as the shallow trench isolation structures 16, 16a. In other words, the semiconductor material 18, 20 may be above or over the shallow trench isolation structures 16, 16a, i.e., not planar with the shallow trench isolation structures 16, 16a.

The semiconductor material 18, 20 may be formed in an epitaxial semiconductor process grown directly on the semiconductor substrate 12 and extending over shallow trench isolation structures 16, 16a. The films (e.g., semiconductor material) 18, 20 grown during the epitaxial semiconductor process may be crystalline in regions over the substrate 12 and polycrystalline over the shallow trench isolation structures 16, 16a. In embodiments, the semiconductor material 18 grown over the semiconductor substrate 12 (and coincident with, slightly extending over, or slightly recessed from the shallow trench isolation structures 16, 16a) may be single crystalline semiconductor material; whereas, the semiconductor material 20 that grows over the shallow trench isolation structures 16, 16a may be polycrystalline material. In embodiments, the optional high resistivity layer 14 and well dopants 11 may be formed prior to or after the formation of the semiconductor material 18, 20.

Figure 3:
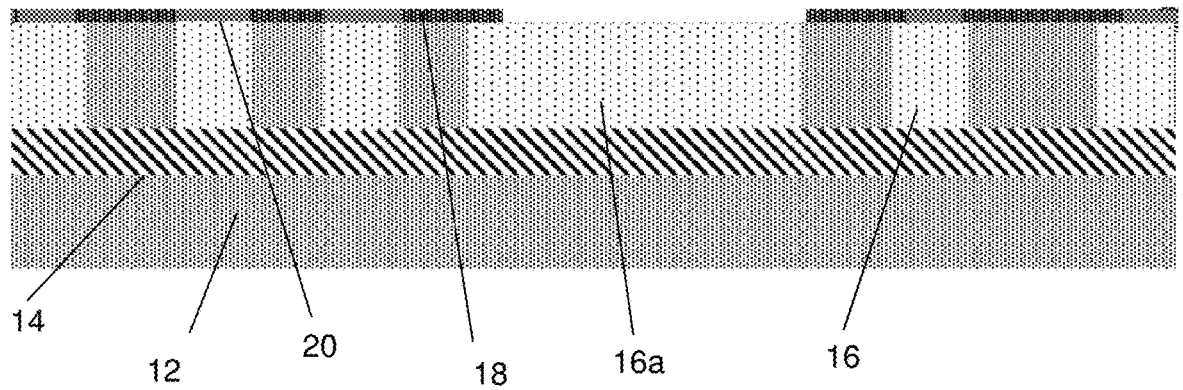
FIG. 3 shows the semiconductor material partially removed over selected shallow trench isolation structure(s), amongst other features, and respective fabrication processes in accordance with aspects of the present disclosure.

As further shown in FIG. 3, the semiconductor material 20, e.g., polysilicon material, may be partially removed over the shallow isolation structure 16a by conventional lithography and etching processes, with a chemistry that is partially or wholly selective to the photoresist. The removal of the semiconductor material 20 will result in a recess (e.g., step down or break) 22 within the semiconductor materials 18, 20 over or adjacent to the shallow trench isolation structure 16a. This recess 22 will prevent shorting between subsequently formed devices. It should also be understood that the remaining semiconductor material 20 over the shallow trench isolation structures 16 may be utilized as source/drain regions (hereinafter referred to as reference numeral 20) of the subsequently formed devices.

Figure 4:
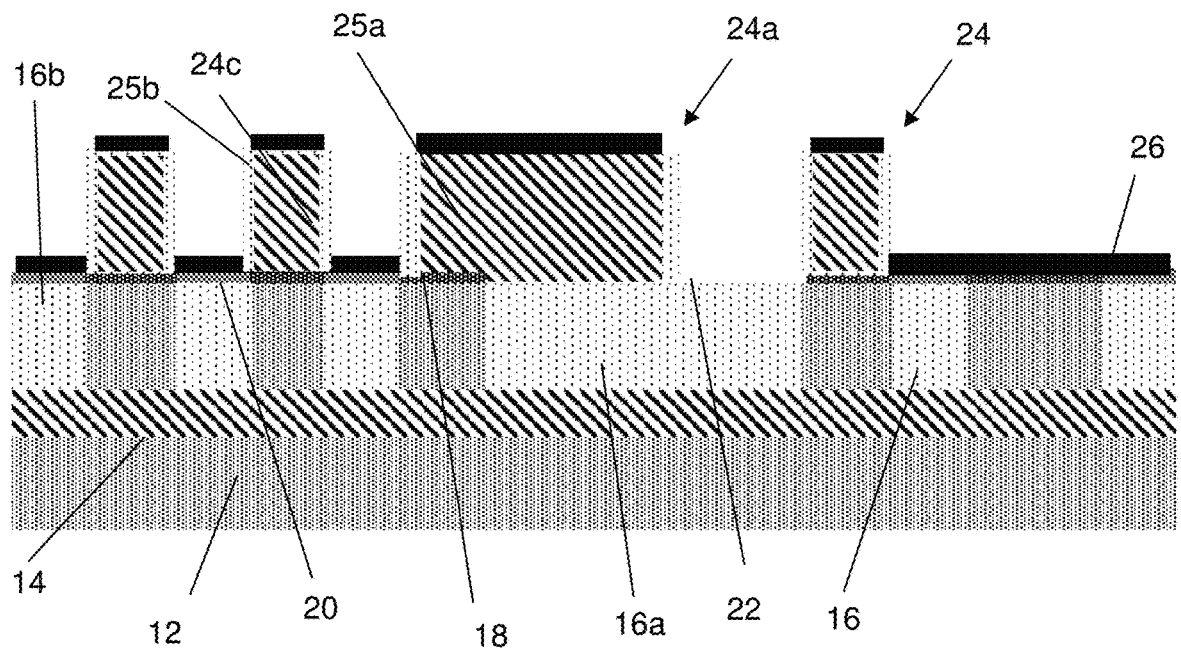
FIG. 4 shows gate structures formed on the semiconductor material, amongst other features, and respective fabrication processes in accordance with aspects of the present disclosure.

In FIG. 4, FET gate structures 24, 24a are formed on the semiconductor material 18 adjacent to the shallow trench isolation structures 16, 16a. In embodiments, the semiconductor material 18 can act as a channel region for the gate structures 24, 24a, which can contact the source/drain regions 20 composed of the crystalline 18 and polysilicon 20 material. Also, the crystalline semiconductor material 18 may separate the polysilicon material 20 from sidewall spacers 25b of the gate structures 24a, 24b. Also, as should be understood by those of skill in the art, the shallow trench isolation structures 16, 16a will remove some of the source/drain junction area 20, which will reduce Coff by providing an insulative region between the polysilicon material and the semiconductor substrate 12 within the source/drain regions. In addition, FIG. 4 further shows the gate structure 24a partially extending over the shallow trench isolation structure 16a. This gate extension 24a could be used for contacting the gates in the subsequent processing used for form conductive contacts and wires.

The gate structures 24, 24a include gate dielectric material and gate material, e.g., polysilicon or metal material, both of which are represented by reference numeral 25a. The gate structures 24, 24a further include sidewall spacers 25b. In embodiments, the gate dielectric material and gate material 25a, e.g., polysilicon or metal material, may be formed by a standard deposition process, e.g., CVD, PVD, ALD, etc., following by a patterning process, e.g., lithography and etching process. The sidewall spacers 25b may be formed by a deposition of insulator material such as nitride or oxide on the patterned materials, followed by an anisotropic etching process. In embodiments, the polysilicon material of the source/drain regions 20 may be separated from the sidewall spacers 25b, above the plane of the channel by the crystalline semiconductor material 18. This will avoid degradation of the FET reliability and electron mobility due to having polysilicon in the channel region.

After additional processing is performed for other features, e.g., halo, extension, well, lightly doped drain, implants, a silicide 26 is formed over the exposed silicon over shallow trench isolation structure 16b in the source/drain regions 20 and exposed silicon substrate 18. If a polysilicon gate FET is used, then the gate material 25a is also silicided. This silicide process, where the gates and source/drain regions are silicided is referred to as a self-aligned silicide process. In this way, silicide 26 will form on polysilicon material over selective shallow trench isolation structures 16 in the source/drain regions 20.

As should be understood by those of skill in the art, the silicide process begins with deposition of a thin transition metal layer, e.g., nickel, cobalt titanium, or platinum, over fully formed and patterned semiconductor devices (e.g., source/drain regions 20 and respective devices 24, 24a). After deposition of the material, the structure is heated allowing the transition metal to react with exposed semiconductor material 18, 20 in the active regions of the semiconductor device (e.g., source/drain regions and gate contact region) forming a low-resistance transition metal silicide. Following the reaction, any remaining transition metal is removed by chemical etching, leaving silicide 26 in the active regions of the device. It should be understood by those of skill in the art that the silicide will not form over any exposed material of the shallow trench isolation structure 16a.

Figure 5:
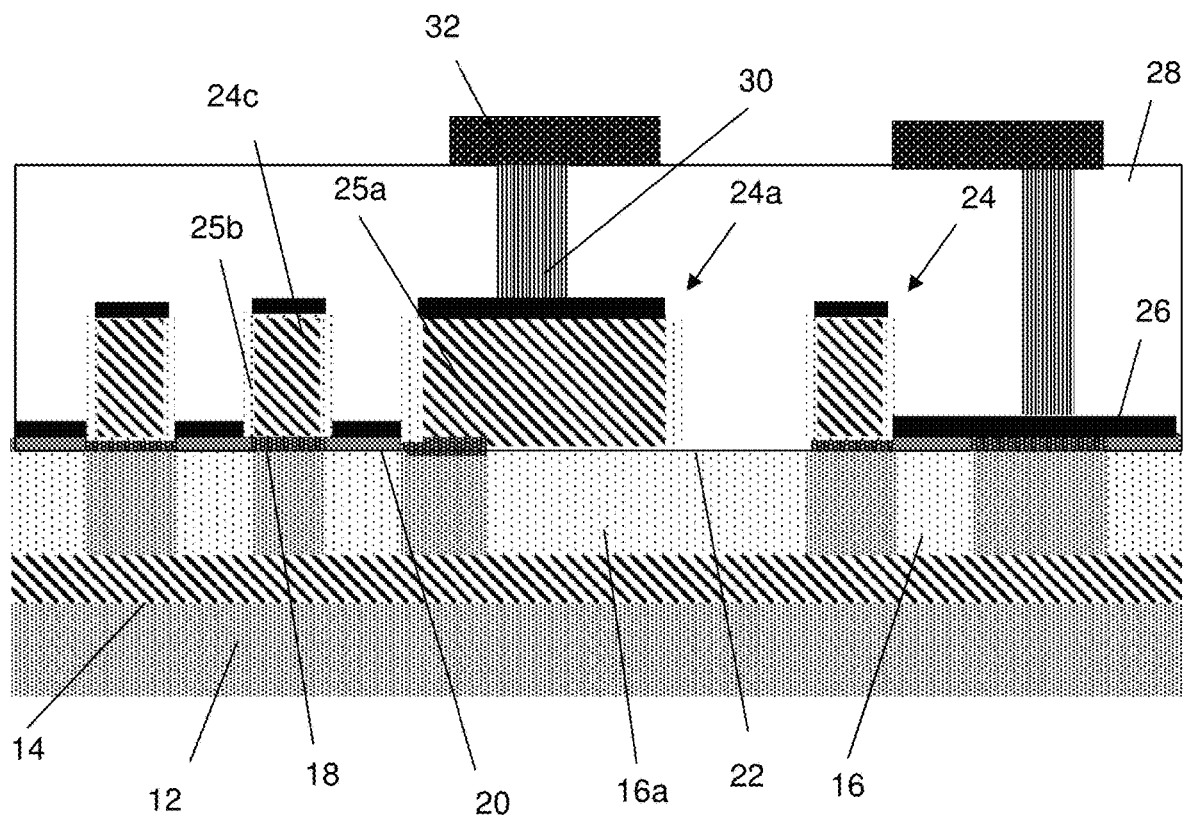
FIG. 5 shows contacts (interconnects) connecting to the gate structures, amongst other features, and respective fabrication processes in accordance with aspects of the present disclosure.

FIG. 5 shows contacts (interconnects) 30 formed to the gate structures 24, 24a and source/drain regions 20, e.g., crystalline and polysilicon material of the source/drain regions 20. In accordance with aspects of the present disclosure, interlevel dielectric material 28, e.g., BPSG, SiCOH, SiO$_2$ and the like may be formed over the gate structures 24, 24a and silicide contacts 26 by a conventional deposition method, e.g., CVD, HDPCVD, etc. After an optional planarization step using, for example, CMP, openings are formed within the interlevel dielectric material 28 to expose portions of the silicide contacts 26 in the source/drain regions 20 and the gate material 25a. The openings can be formed by conventional lithography and etching processes such that no further explanation is required for an understanding of the present disclosure. A metal or metal alloy material may be deposited in the openings, e.g., aluminum of tungsten, to form the interconnects 30. Wiring structures 32 may then be formed by conventional back end of the line (BEOL) CMOS processes, connecting to the interconnects 30. The wiring structures 32 may be composed of copper or other metal or metal alloy materials that are suitable for CMOS fabrication processes.

Figure 6:
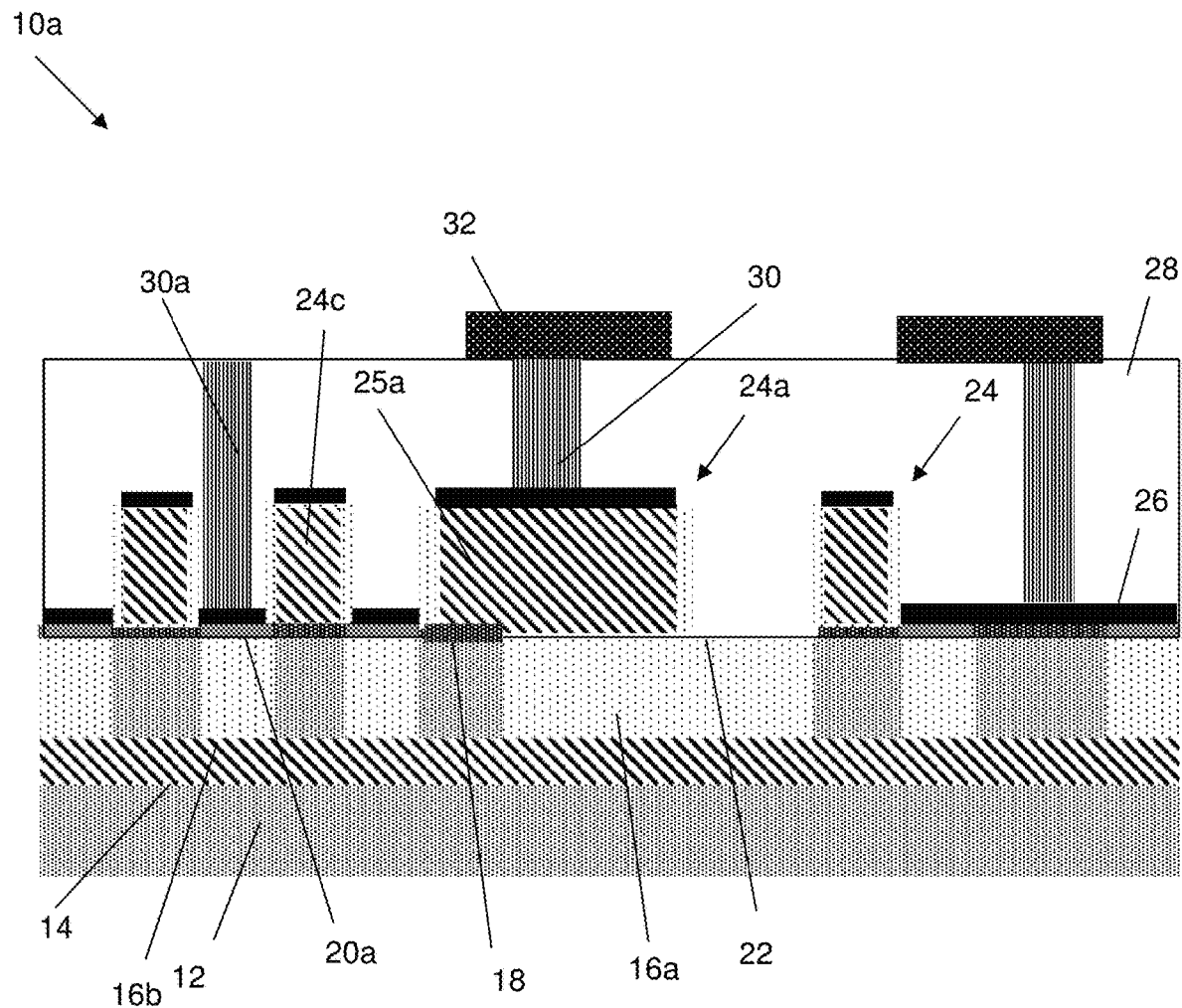
FIGS. 6-11 show different device configurations in accordance with several aspects of the present disclosure.

FIG. 6 shows another device structure in accordance with aspects of the present disclosure. In structure 10a, a contact (interconnect) 30a is shown to be in direct contact with the silicide contact 26 in the source/drain region 20a of adjacent devices, directly above a shallow trench isolation structure 16b. Contact 30a could be electrically contacting the source or drain region of a multi-finger FET. The remaining features are similar to that shown in FIG. 5.

Figure 7:
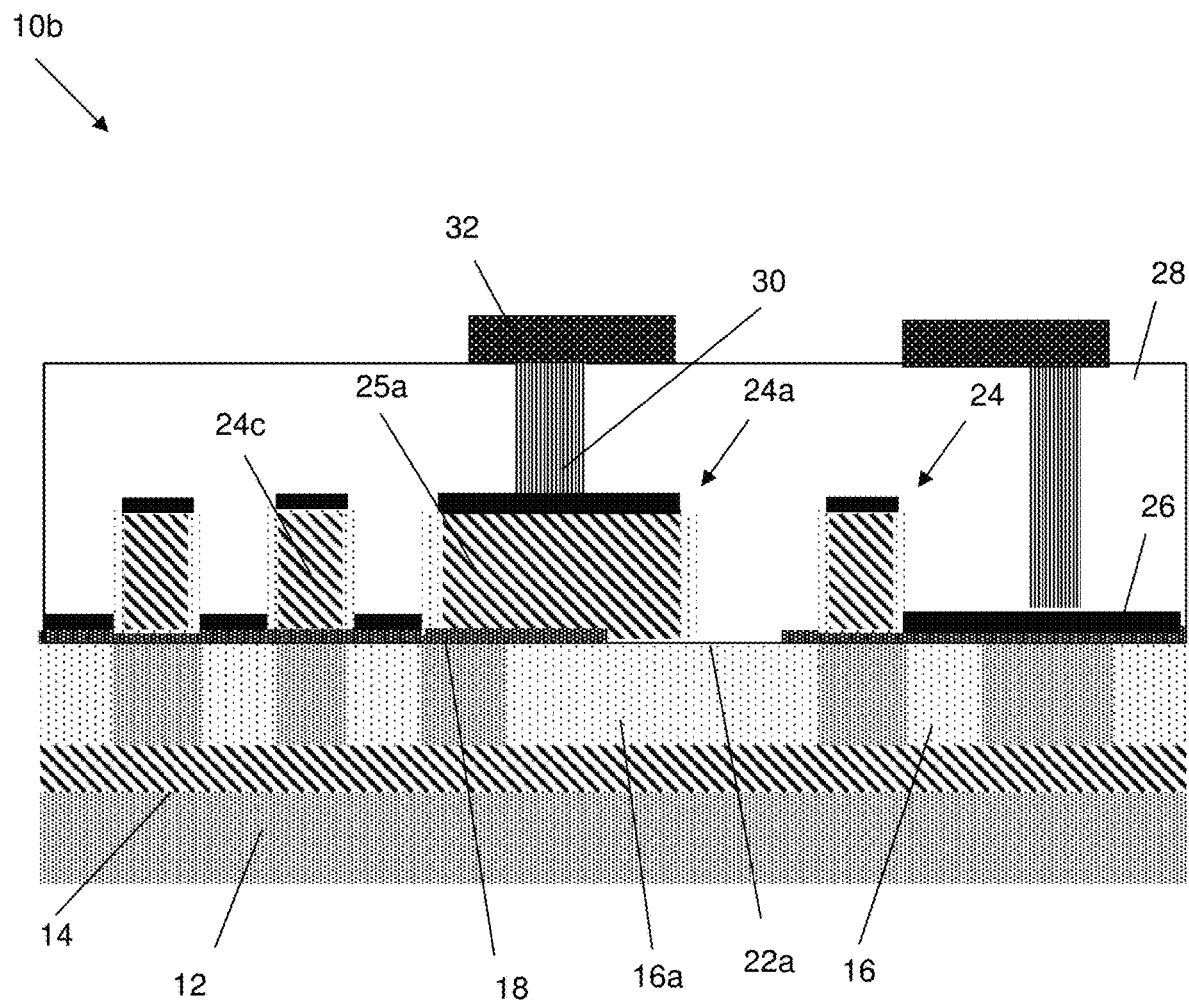

FIG. 7 shows another device structure in accordance with aspects of the present disclosure. In structure 10b, the semiconductor material 18, e.g., single crystalline silicon instead of polysilicon, may be grown over the shallow trench isolation structures 16, 16a using a lateral epitaxial growth process known to those of skill in the art. In this implementation, though, the semiconductor material 18 will not grow entirely over the surface of the shallow trench isolation structure 16a due to its critical width dimension. Accordingly, in this way, an opening 22a (e.g., step down or break over the shallow trench isolation structure 16a) of the semiconductor material 18 will prevent shorting of adjacent devices. This is similar to the opening 22 of FIG. 5, and may be with or without the need for additional processing steps, e.g., lithography and etching processes. The silicide contacts 26 are provided on the semiconductor material 18, in the source/drain regions. The remaining features are similar to that shown in FIGS. 5 and/or 6.

Figure 8:
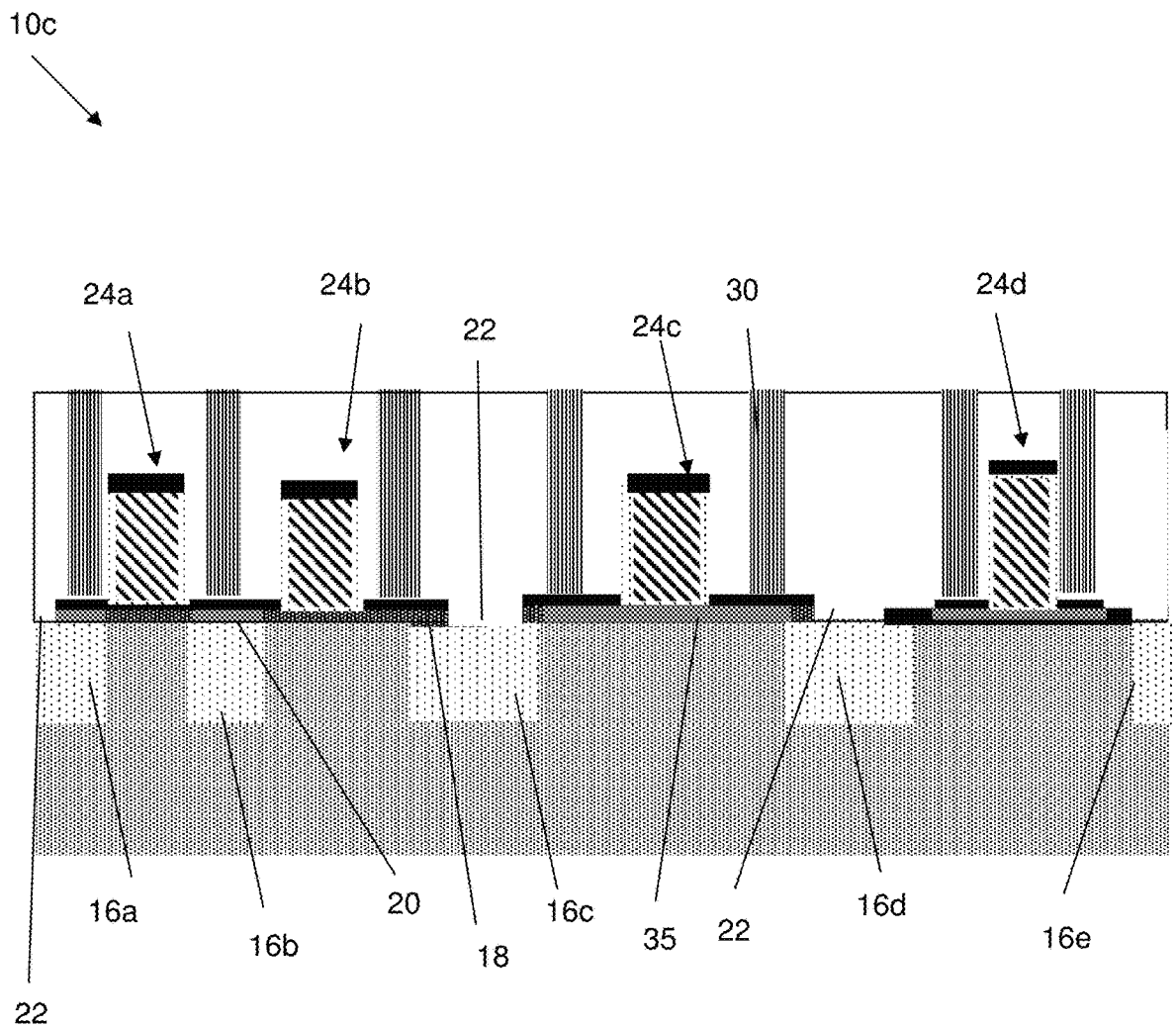

FIG. 8 shows another device structure in accordance with aspects of the present disclosure. The structure 10c of FIG. 8 shows devices 24a, 24b, 24c, 24d and shallow trench isolation structures 16a, 16b, 16c, 16d, 16e. In this embodiment, the devices 24a are a two finger FET, 24b is a one finger FET with the same doping as devices 24a and b, and 24c is a one finger FET with different doping as devices 24a, 24b, and 24c. The examples above with one and two finger FETs are examples only and FETs with any number of fingers, LDMOS FETs, and passive elements such as MOS capacitors are also contemplated herein.

These FET include a crystalline silicon source/drain region near the channel with the shallow trench isolation structure 16b under the source/drain regions, away from the channel and capped with silicided polysilicon material (e.g., source/drain region 20); whereas, device 24d may include a crystalline silicon source/drain region 35 near the channel with the shallow trench isolation structure 16d separating devices 24c, 24d. In embodiments, the polysilicon material 20 is under the FET channel, under the FET spacer, or outside of the FET spacer. In embodiments, the crystalline silicon 18 near the channel region can avoid reliability and mobility degradation. Moreover, a step down (e.g., break or recess 22) over the shallow trench isolation structures 16c, 16d will prevent shorting together of the devices 24a, 24b, 24c, 24d. An additional planar device may also be formed using an added mask, e.g., nitride mask, to protect the device from crystalline silicon and polysilicon growth.

Figure 9A:
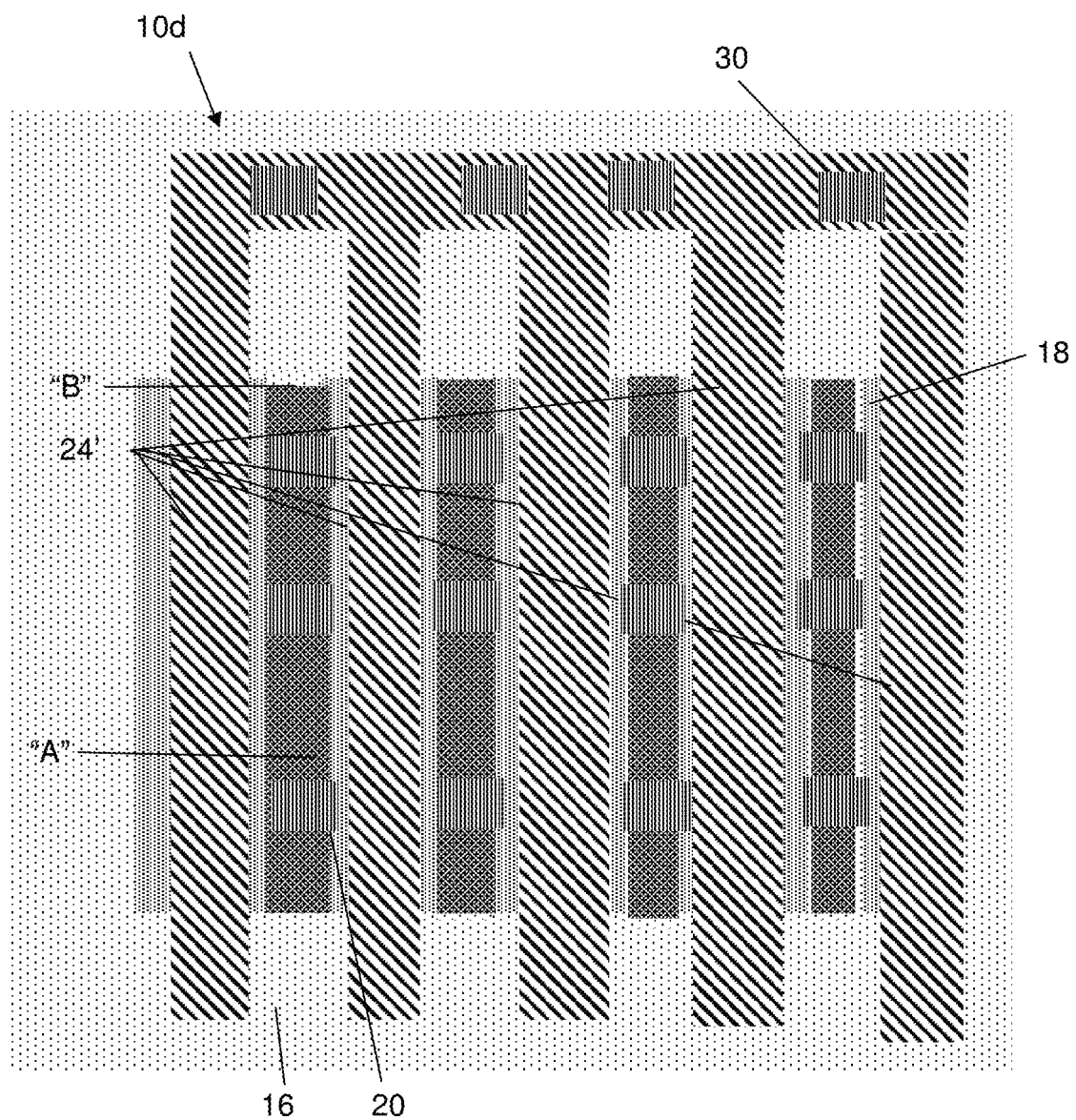
Figure 9B:
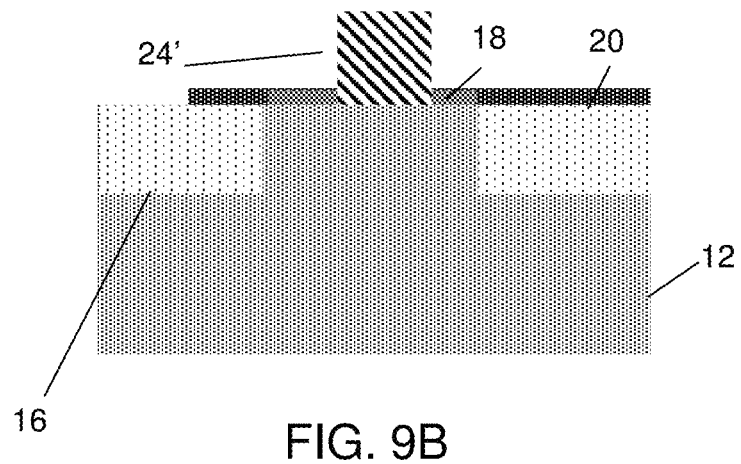
Figure 9C:
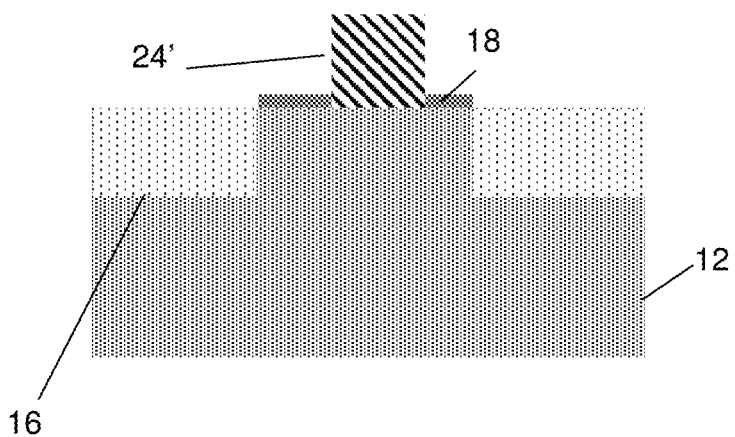

FIGS. 9A-9C show different views of a multi-finger device 10d in accordance with aspects of the present disclosure. More specifically, FIG. 9A shows a top view of a multi-finger device 10d; whereas, FIG. 9B shows a cross-sectional view of the multi-finger device 10d along line "A" and FIG. 9C shows a cross-sectional view of the multi-finger device 10d along line "B". As shown, the multi-finger device 10d includes source/drain regions 20 between the device fingers 24'. The source/drain regions 20 may be composed of polysilicon material or Si crystalline material, in different embodiments, over the shallow trench isolation structures 16; whereas, the device fingers 24' may be provided over crystalline silicon. In this configuration, the polysilicon material of the source/drain regions 20 are above, planar with, or below the crystalline silicon and the drawings show them coplanar.

Also, as shown in FIG. 9B, the polysilicon material extends partially over the shallow trench isolation structure 16. Moreover, in FIG. 9C, the polysilicon material is removed over the shallow trench isolation structure 16. This can be accomplished with a resist patterning and etching process which will eliminate source/drain shorting and which also creates a crystalline silicon under the gate structure 24. For simplicity, the gate structure 24 is shown without spacers and silicide.

Figure 10A:
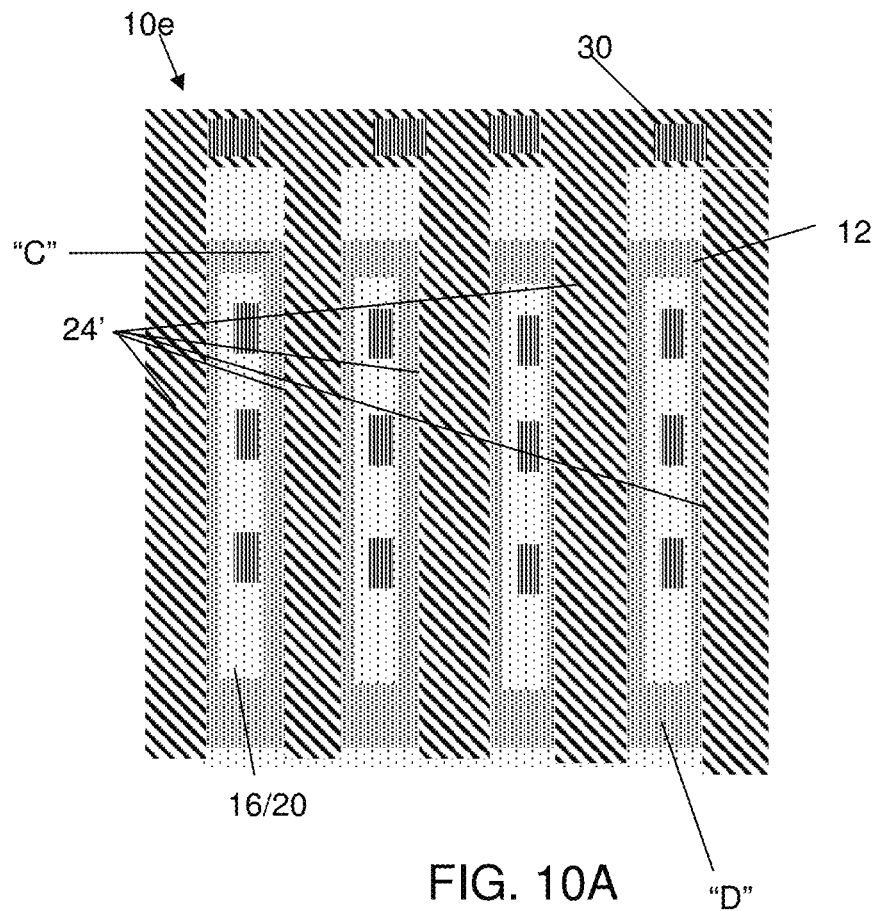
Figure 10B:
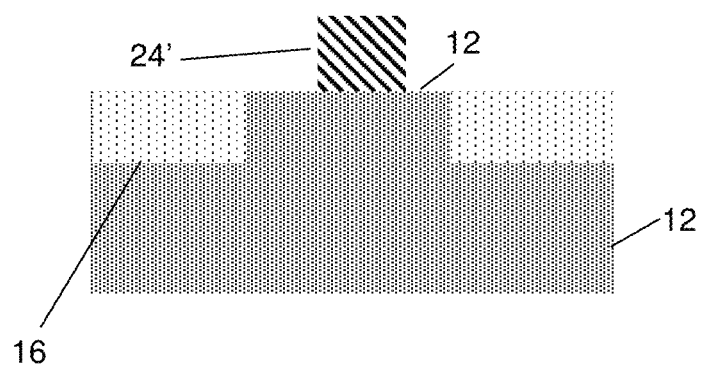

FIGS. 10A and 10B show different views of a multi-finger device 10e in accordance with additional aspects of the present disclosure. More specifically, FIG. 10A shows a top view of a multi-finger device 10e and FIG. 10B shows a cross-sectional view of the multi-finger device 10e along line "C". As shown, the multi-finger device 10e includes source/drain regions 20 between the device fingers 24' and over the shallow trench isolation structures 16. In this embodiment, along line "C", the crystalline epitaxial semiconductor material and polysilicon material are removed, while maintaining the shallow trench isolation structure 16. This can be accomplished with an etching process which will eliminate source/drain shorting.

Figure 11:
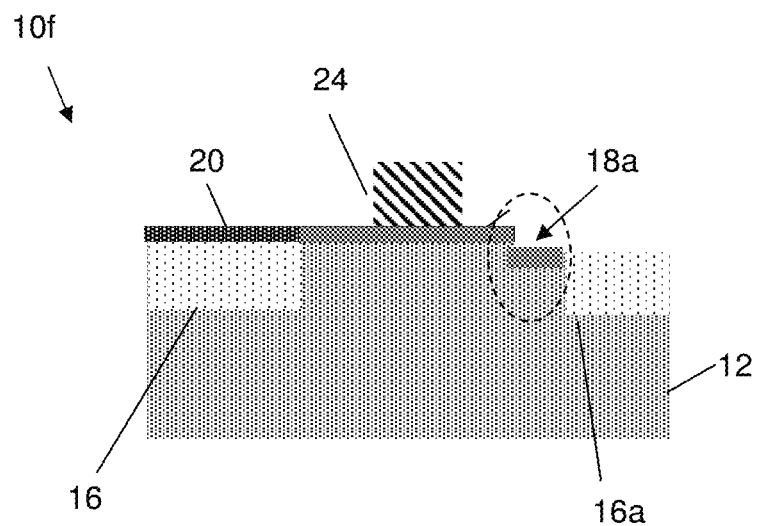

FIG. 11 shows a structure 10f comprising a stepped source/drain region 18a adjacent to the shallow trench isolation structure 16a along line "D". In embodiments, the masked etch of the polysilicon over the shallow trench isolation region will extend over the crystalline silicon such that, outside of each FET, no polysilicon over the shallow trench isolation remains adjacent to the FET. This eliminates all polysilicon over the shallow trench isolation on the periphery of the FET, reducing the chance of RF parasitics in the said polysilicon or electrical shorts in the FET. In embodiments, the stepped source/drain region 18a may comprise any combination of the epitaxial semiconductor material 18 and the semiconductor substrate 12, depending on the masking processes, e.g., lithography and etching processes. For example, the structure 10f can be provided by a masked polysilicon etch back with a mask edge over the semiconductor material and polysilicon region, post gate structure formation. The opposing side of the gate structure 24 may comprise the polysilicon material for the source/drain region 20, over the shallow trench isolation structure 16a. In this embodiment, the polysilicon material of the source/drain region 20 may be spaced away (e.g., separated) from the sidewall spacers of the gate structure 24. In the embodiment shown in FIGS. 10A, 10B and 11, there is polysilicon or crystalline silicon over the shallow trench isolation structures in the interior of the FET, but there is also shallow trench isolation structures, the oxide surface of the shallow trench isolation structure or the substrate crystalline silicon surface on the edge of the FET. This can avoid shorting together of gate fingers in the FET or of the FET to adjacent devices.

The devices can be utilized in system on chip (SoC) technology. It should be understood by those of skill in the art that SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also commonly used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
   at least one gate structure and accompanying source/drain regions;
   isolation structures under the source/drain regions and partially under the at least one gate structure, and upper surfaces of a substrate material and the isolation structures are planar; and
   semiconductor material on a surface of the at least one isolation structure of the isolation structures which comprises the source/drain regions and on an upper surface of the substrate material, wherein:
   the semiconductor material extends onto and in direct contact with the upper surface of the substrate material adjacent to the isolation structure under the at least one gate structure;
   the at least one gate structure includes two gate structures;
   a first gate structure of the gate structures extends over and is in direct contact with a first isolation structure of the isolation structures;
   the source/drain regions is directly in contact with a second isolation structure of the isolation structures, between the two gate structures;
   a silicide is provided on the source/drain regions between the two gate structures; and
   the second gate structure is on and contacts the semiconductor material on the upper surface of the substrate material.

2. The structure of claim 1, wherein the semiconductor material comprises crystalline Si material on the substrate material and polysilicon material on the isolation structures.

3. The structure of claim 2, wherein the at least one gate structure is located over the crystalline Si material.

4. The structure of claim 2, wherein the at least one gate structure comprises a multi-finger gate structure with a plurality of fingers over the crystalline Si material.

5. The structure of claim 2, wherein the crystalline Si material partially overlaps onto a surface of the isolation structures.

6. The structure of claim 2, wherein sidewalls spacers of the at least one gate structure are at a junction of the polysilicon material and the crystalline Si material.

7. The structure of claim 2, further comprising silicide covering the polysilicon material and over the at least one gate structure, and contacts connecting to the silicide in the source/drain regions and over the at least one gate structure.

8. The structure of claim 2, wherein the polysilicon material includes a break on at least one of the isolation structures.

9. The structure of claim 1, wherein the semiconductor material comprises crystalline Si material on the substrate material and polysilicon on the isolation structures.

10. The structure of claim 9, wherein the crystalline Si material is a discontinuous layer.

11. The structure of claim 1, further comprising a silicide on the semiconductor material of the source/drain regions and over the at least one gate structure, and an interconnect contact on the silicide in the source/drain regions and the at least one gate structure.

12. The structure of claim 1, further comprising a high resistivity layer within a semiconductor substrate, below the isolation structures.

13. A structure comprising:
a semiconductor substrate;
a gate structure and accompanying source/drain regions over the semiconductor substrate;
at least one shallow trench isolation structure within the semiconductor substrate and under the source/drain regions of the gate structure and the gate structure, and upper surfaces of the semiconductor substrate and the at least one shallow trench isolation structure being planar;
semiconductor material over the at least one shallow trench isolation structure and the upper surface of the semiconductor substrate, and under the gate structure, the semiconductor material comprising the source/drain regions over the semiconductor substrate;
a second gate structure with accompanying source drain regions over the semiconductor substrate, the second gate structure being over the semiconductor material and adjacent to the at least one shallow trench isolation structure; and
silicide on the semiconductor material over the at least one shallow trench isolation structure, wherein:
the semiconductor material over the at least one shallow trench isolation structure comprises polysilicon material and the semiconductor material under the gate structure comprises crystalline Si material;
the gate structure extends over and is in direct contact with a first shallow trench isolation structure of the at least one shallow trench isolation structure;
the source/drain region of the gate structure is directly in contact with a second shallow trench isolation structure of the at least one shallow trench isolation structure, between the gate structure and the second gate structure; and
the second gate structure is on and directly contacts the semiconductor material which directly contacts the upper surface of the semiconductor substrate.

14. The structure of claim 13, wherein the polysilicon material is separated from the gate structure by the crystalline Si material.

15. The structure of claim 14, further comprising an interconnect structure connecting to the silicide in the source/drain regions of the gate structure.

16. The structure of claim 14, wherein the polysilicon material is a discontinuous layer and is provided on at least a portion of the at least one shallow trench isolation structure.

17. The structure of claim 13, wherein the semiconductor material over the at least one shallow trench isolation structure and under the gate structure comprises crystalline Si material.

18. A method comprising:
forming at least one gate structure and accompanying source/drain regions;
forming isolation structures under the source/drain regions and partially under the at least one gate structure, and also in a substrate material, and upper surfaces of the substrate material and isolation structures are planar; and
forming semiconductor material on a surface of the at least one isolation structure of the isolation structures which comprises the source/drain regions and on an upper surface of the substrate material, wherein:
the semiconductor material extends onto and in direct contact with the upper surface of the substrate material adjacent to the isolation structure under the at least one gate structure;
the at least one gate structure includes two gate structures;
a first gate structure of the gate structures extends over and is in direct contact with a first isolation structure of the isolation structures;
the source/drain regions is directly in contact with a second isolation structure of the isolation structures, between the two gate structures;
a silicide is provided on the source/drain regions between the two gate structures; and
the second gate structure is on and contacts the semiconductor material on the upper surface of the substrate material.

* * * * *